United States Patent Office 3,826,651 Patented July 30, 1974

3,826,651

LAMINATED ALUMINUM ARTICLE AND METHOD

Charles H. Weber III, Silver Spring, and John E. Pickard, Ellicott City, Md., assignors to W. R. Grace & Co., New York, N.Y.

No Drawing. Original application May 13, 1971, Ser. No. 143,174. Divided and this application Apr. 23, 1973, Ser. No. 353,815

Int. Cl. G03c *1/94, 5/00*

U.S. Cl. 96—35.1 11 Claims

ABSTRACT OF THE DISCLOSURE

The present invention is directed to a composite laminated article useful as a base plate for supporting a layer of liquid photocurable composition from which articles such as polymeric printing plates may be formed. The article is necessarily adapted to have a gold color and includes a sheet of aluminum-containing metal, an inorganic conversion coating over the sheet, and a coating of a specific vinyl resin over the conversion coat.

This is a division of application Ser. No. 143,174 filed May 13, 1971.

The present invention relates to a composite laminated article useful as a substrate for a liquid photocurable composition from which articles such as polymeric printing plates may be formed. A process for preparing the article is also provided.

Commercial acceptance of heretofore known printing plates having a polymeric printing layer has been impeded for reasons such as unsatisfactory adherence of the polymer layer to various substrates. Good adherence of the polymer layer to the substrate is especially important in large volume printing applications such as those encountered in the newspaper industry. A number of otherwise suitable heretofore known substrates have suffered a serious drawback in that they undesirably reflect light in a manner such that unsatisfactory images are formed in the photocurable layer to be printed.

It has now been found by practice of the present invention that composite laminated articles may be formed which exhibit excellent adherence of liquid photocurable composition thereto. The present article is further desirably characterized in that it is substantially non-reflective of incident ultraviolet light such as may be received thereon through a liquid curable composition from which a printing layer may be formed on the article.

Generally stated, the present invention is for a composite laminated article which is generally gold in color and includes a sheet of aluminum having an inorganic conversion coating thereover. (By aluminum is meant aluminum per se and aluminum alloys containing major amounts of aluminum and minor amounts of other elements, principally other metals.) The conversion coating, in turn, has a coating of vinyl resin, hereinafter described, which is characterized with excellent adhesive properties for adhering a liquid photocurable composition thereto. The liquid photocurable composition may be layered onto the vinyl coating and cured by exposure to actinic light such as that projected through a master transparency in forming articles such as polymeric printing plates. It has also been found by practice of the present invention that when supported liquid photocurable composition is selectively exposed to actinic radiation the supporting article is essentially non-reflective to ultraviolet light, thereby resulting in increased definition of the resulting images.

In a preferred embodiment, the present article is formed of thin flexible construction suitable for use as a substrate for polymeric printing plates which find use in numerous printing operations, including those conducted on rotary printing cylinders. While it is recognized that the present article may usefully serve as a substrate in other applications, the balance of this description will be given principally with reference to forming the article in such substrate-useful form.

The aluminum-containing metal sheet of the present article may be of aluminum or alloys thereof which contain a major amount of aluminum. Suitable aluminum alloys are exemplified by those known in the art as Alloy 1100 and Alloy 3003 (names adopted by The Aluminum Association). These alloys contain minor amounts of silicon, iron, copper, manganese, zinc and the like. The aluminum sheet may have a temper in the range, for example, from about H12 to about H19, and preferably about H14. While aluminum sheets having temper below about H12 are operable herein, they generally do not provide suitable hardness for printing use. The sheet thickness may be in a range from about 5 to about 15 mils, and preferably from about 8 to about 10 mils. Desirably, prior to forming the conversion coating on the aluminum sheet, the aluminum is cleaned in a non-etching cleaning bath.

It is an essential step in carrying out this invention that the vinyl coating be applied to aluminum sheet which has been subjected to a conversion coating treatment. Conversion coating treatments for aluminum are well-known in the art. In general, these treatments involve removal of the very thin but highly inert coating of aluminum oxide on the surface of the aluminum sheet and replacing it with aluminum salts which cover the surface in an interstitially permeable film intimately integral with the aluminum, permitting deposition of further coating such as lacquers, etc. A number of conversion coatings are available commercially under various trademarks, e.g., Iridite, Alodine, Bonderite, and others. These compositions are generally acidic in character and in general contain acid salts such as chromates, fluorides, and the like. Some conversion coatings may contain phosphate. These coatings and their use have been described in the literature. A typical recipe, quite suitable for use in this invention is described in Example 2 of U.S. Pat. 3,279,958. As shown in that example, a mixed oxide-chromate coating is deposited.

Accordingly, when the terms "conversion coating," "conversion-treated," "chromate-treated" and the like are used in the instant specification and claims, it is to be understood that conventional conversion coating processes and the results thereof are included.

Excellent vinyl resin bonding properties are found to be provided simply and electrolessly by conversion coating aluminum sheet, without requiring application of external voltage. The coating may be applied in any suitable manner, e.g., by spraying a conversion coating solution onto the sheet, by immersing the sheet in coating solution, and the like.

After the aluminum sheet has been conversion coated, the treated sheet may be rinsed in a suitable solution, and desirably thereafter it is rinsed in water and dried. The inorganic conversion coating may be applied at a rate from about 25 to about 50 milligrams dry basis of coating per square foot of the aluminum sheet, and preferably from about 25 to about 35 milligrams dry basis per square foot. The amount of coating which is formed depends on the nature of the coating bath and the duration of contact of the aluminum sheet therewith. Generally, the amount of coating may be controlled by controlling duration of such contact. In general, conversion coatings of less than about 25 milligrams per square foot result in unacceptably poor adherence of the vinyl resin, while coatings in excess of 50 milligrams per square foot do not sufficiently increase vinyl adhesion to justify the added cost thereof.

The critical gold color of the article may be provided simply by some of the conversion coats which are useful herein. However, improved optical properties and greater versatility are provided by including a suitable dye in the vinyl resin coating, which is subsequently described.

The vinyl resin layer is a uniform layer necessarily comprising poly(vinyl chloride/vinyl acetate). Terpolymers formed of maleic anhydride and the like with vinyl chloride and vinyl acetate are also useful herein. Maleic anhydride may be included in the poly(vinyl chloride/vinyl acetate) resin in an amount from about 1 to about 10 percent by weight, and preferably from about 1 to about 3 percent by weight. Unexpectedly, a variety of resins not including poly(vinyl chloride/vinyl acetate) have proved to be inadequate for use herein. The resin coating may have thickness in a range from about 0.01 to about 1 mil and preferably from about 0.20 to about 0.35 mil. The vinyl resin may be, for example, VMCH, trademark for a poly(vinyl chloride/vinyl acetate) resin product by Union Carbide. The resin coating may be applied to the chromate conversion coating from a solution of the resin in any suitable solvent system. Other dispersed resin forms may prove useful. Numerous solvents for VMCH are known, e.g., methylisobutylketone, methyl ethyl ketone, isophorone, mixtures thereof, etc. The poly(vinyl chloride/vinyl acetate) resin may be included in the resin solution in any suitable amount, and preferably about 20 parts by weight of resin per 100 parts by weight of resin solvent system.

As indicated above, the gold color found critical for imparting the necessary optical properties to the article is preferably provided by including gold color producing dyestuff in the resin layer. The dye may be included in the resin layer simply by way of contacting the chromate-treated aluminum with a vinyl resin solution having the dye uniformly mixed therewith. The quality of images resulting from selectively exposing liquid photocurable composition which may be deposited onto the vinyl layer is dependent on the amount of dye included. In general, maximum quality images result where the algebraic product T times R is in the range from about 0.001 to about 0.005 and preferably from about 0.002 to about 0.003, where T is the thickness of the resin layer in mils and R is the ratio of parts by weight of dye to parts by weight of resin. For example, at a layer thickness of about 0.25 mil of resin the ratio of dye to resin is preferably from about 0.8 to about 1.2 parts by weight of total dye per 100 parts by weight of resin, while at a resin layer thickness of about 0.50 mil the amount of dye is preferably from about 0.4 to about 0.6 parts by weight of dye per 100 parts by weight of resin.

It is also critical that the gold color producing dye be a mixture of red dye with yellow dye. Eminently suitable optical properties are provided when the dye is a mixture of about 0.1 part by weight of red organic dye per about 1 part by weight of yellow organic dye.

Any suitable means may be used for applying the dye-containing resin solution onto the article. For example, the solvent-dye-resin may be deposited onto the article and thereafter drawn thereover to a suitable thickness using a draw bar. The applied resin coating may then be dried as by air at a temperature from about 350° F. to about 400° F. for a suitable time period for removing the solvent and for adhering the resin to the article. It is critical that the resin coating not be overdried because overdrying results in substantial reduction of the adhesive properties of the vinyl coating for adhering liquid photocurable composition thereo. Suitable drying times are usually dependent on the solvent concentration and the thickness of the applied resin coating. Generally, however, drying time should not exceed one minute at or above 400° F. for articles having a resin coating thickness from about 0.1 to about 0.4 mil. Drying at temperatures in excess of about 420° F. generally results in poor adhesion of liquid photocurable composition to the vinyl resin.

A printing plate may be formed of the present article, generally, by depositing liquid photocurable composition onto the vinyl resin layer and thereafter selectively exposing the deposited liquid composition to actinic radiation to insolubilize the exposed areas with non-exposed areas remaining generally liquid and removable.

The term liquid photocurable composition as used herein is intended to mean a liquid composition generally having a viscosity in the range from slightly above 0 to about 20 million centipoises at 70° C. whch is solidified by either photocuring or photopolymerization or both on exposure to radiation from actinic light.

A suitable liquid photocurable composition for use herein is that including (a) a polyene having at least two reactive unsaturated carbon to carbon bonds per molecule, (b) a polythiol having at least two thiol groups per molecule, the total combined functionality of (1) the reactive unsaturated carbon to carbon bonds per molecule in the polyene and (2) the thiol groups per molecule in the polythiol being greater than 4, and (c) a photocuring rate accelerator. A detailed description of such liquid photocurable compositions and the manner of making them is set out in U.S. Pat. No. 3,537,853 to Wessells and Gush. A preferred polyene for preparing a printing plate using the present article as a substrate is a mixture of about 20 percent by weight of the compound having formula (A) with about 80 percent by weight of the compound having formula (B) as follows:
formula (B) as follow:

(A)

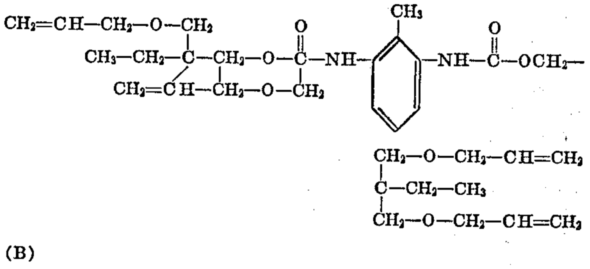

(B)

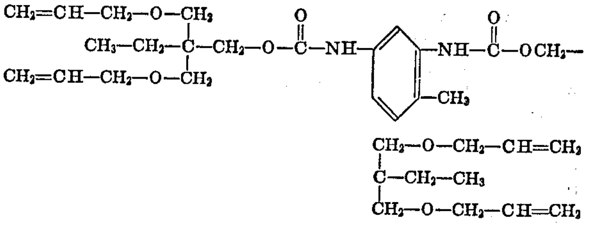

A preferred liquid photocurable composition includes from about 10 to about 90 parts by weight of the above described polyene component, from about 90 to about 10 parts by weight of pentaerythritol tetrakis (β-mercaptopropionate) and from about 1 to about 10 parts by weight of benzophenone.

It is to be understood that chromate coating may be applied to either one or both of the aluminum sheet surfaces as desired. As a general preference, conversion coating is applied to both surfaces of the aluminum sheet for added protection. Conveniently, an endless sheet of aluminum may be conversion coated on both surfaces simultaneously as by passing the endless sheet through a conversion coating bath. The coated sheet may be taken up coilwise on a receiving roll. Conversion coating both sides of the aluminum sheet is found to aid in relieving stresses which may develop in rolling up the article. Where both surfaces of the aluminum sheet are conversion coated, the article is preferably formed by adhering a first layer of vinyl resin to one of the coated surfaces and a second layer of vinyl resin to the other coated surface. This variation of the present article, i.e., having dye-containing resin coating on two sides provides increased versatility, additional aesthetic value, and greater stress relief.

The present invention will be further illustrated by the following non-limiting examples.

EXAMPLE 1

A 3003 type aluminum alloy sheet having a thickness of about 0.009 inch and temper of about H12 to H14 was cleaned in a non-etching cleaner and given a chromate conversion coating treatment on both surfaces using the procedure of Example 2 in U.S. Pat. No. 3,279,958. The resulting mixed oxide-chromate coatings each had a weight averaging about 30 to 40 milligrams per square foot of the aluminum sheet. The chromate-coated sheet was rinsed in dilute chromic acid, followed by water rinsing and drying, all as taught also in Example 2 of U.S. 3,279,958. Next, the dried sheet was immersed in a bath at 78° F. containing about 20 parts by weight of VMCH, trademark for a poly(vinyl chloride/vinyl acetate) resin product by Union Carbide, uniformly mixed with 1 part by weight of a gold color producing mixture of about 10 percent by weight of red dye and about 90 percent by weight of yellow dye throughout about 80 parts by weight of a methylisobutylketone-based solvent mixture. After about 30 seconds, the sheet was removed from the resin bath, and thereafter the applied solvent-resin-dye layers were drawn to uniform thickness using a Gardner-Denver draw bar. The article was then placed in an oven for about 2 to 3 minutes at 375° F. The resulting poly(vinyl chloride/vinyl acetate) resin layers, having gold color producing dye mixture uniformly mixed therein, were each found to have substantially uniform thickness of about 0.25 mil. Peel tests showed excellent adherence of the resin to the chromate-treated aluminum.

The dried article was placed flat on the work area of a photocuring apparatus equipped with a 4000-watt Series 1100 Ascorlux xenon lamp positioned about 26 inches above the work area. A liquid photocurable composition was deposited onto the exposed vinyl resin surface of the placed article and layered to a uniform thickness of 20 mils using a doctor blade. The liquid photocurable composition included about 20 parts by weight of pentaerythritol tetrakis (β-mercaptopropionate); about 10 parts by weight of benzophenone as a photocuring rate accelerator; and about 70 parts by weight of a mixture of polyene isomers having the following general formula:

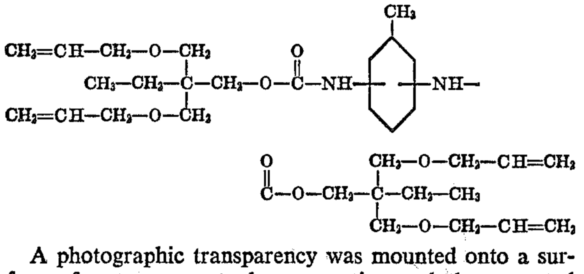

A photographic transparency was mounted onto a surface of a transparent glass mounting and the mounted transparency was positioned about 10 mils above the curable composition in parallel relationship to the article. The supported liquid composition was thereafter exposed to ultraviolet light projected from the lamp selectively through the transparency for about 2 to 3 minutes during which period the composition solidified in the exposed areas. The article was then etched in an ultrasonically activated bath containing an aqueous detergent solution, resulting in removing the uncured composition in the unexposed areas. Thereafter, the etched article was water rinsed and air dried to form a light-weight flexible printing plate. Measurements at randomly selected positions on this plate showed that the height of the relief images above the vinyl coating was, on the average, about 20 mils with a tolerance of ±0.5 mil.

On repeated printing in high-speed rotary press service, this plate was found to exhibit excellent adherence of the images to the article. The high quality and fine resolution of the indicia printed using the printing plate evidenced excellent image definition. A marked improvement was shown over the marginal quality printing often obtained when conventional reflective substrates are used for supporting this curable polymer system.

EXAMPLE 2

The procedure of Example 1 was repeated except that the dye included in the vinyl resin was gold dye. On printing the resulting plate, substantially lower quality images resulted relative to the quality observed for the Example 1 plate containing a gold color producing mixture of red dye and yellow dye.

EXAMPLES 3 TO 6

The procedure of Example 1 was again repeated except using, individually, red, orange, purple, and yellow-green dyes. On printing with the resulting printing plates, unacceptably low quality of the printed images was observed, evidencing substantially lower fidelity of the printing plate images relative to that observed for the Example 1 plate.

EXAMPLES 7 TO 12

Example 1 was again repeated except that in place of the poly(vinyl chloride/vinyl acetate) resin product the following resins were used: alkyl, phenolic, vinyl phenolic, polyester, epoxy, and epoxy novolak. These resins were coated onto the chromate conversion coatings of the articles using industry accepted practices therefor. Peel tests showed that adherence of the cured liquid photocurable composition to these articles was, in all cases, substantially inferior to that of Example 1.

EXAMPLE 13

The procedure of Example 1 was again repeated except that each of the conversion coatings was applied at a rate of about 0.1 milligram per square foot of aluminum sheet. Peel tests showed that adherence of the poly(vinyl chloride/vinyl acetate) resin product to these conversion coatings was substantially inferior relative to the observed adherence of resin to the 30–40 milligram per square foot conversion coating of the Example 1 plate.

EXAMPLE 14

Example 1 was again repeated except that the resin coatings were dried for two minutes at a temperature of about 430° F. Peel tests showed that the adherence of the cured liquid photocurable composition to this article was substantially inferior to that of Example 1.

EXAMPLE 15

The procedure of Example 1 was again repeated except that the dye mixture was replaced with a gold color producing pigment. The resulting article exhibited unacceptably low adhesion of the curable liquid polymer to the poly(vinyl chloride/vinyl acetate) resin coating, relative to the adherence observed for the dye-containing resins of the Example 1 article.

It is to be understood that the foregoing detailed description is given merely by way of illustration and that various modifications may be made therein without departing from the spirit or scope of the present invention.

What is claimed is:

1. A composite laminated article, for use as a printing plate with an applied layer of liquid photocurable composition, which comprises an aluminum sheet having a chromate conversion coated surface, a resin coating comprising poly(vinyl chloride/vinyl acetate) over said conversion coated surface, and a layer of liquid photocurable composition over said resin coating, said article adapted to have generally gold color by inclusion of a generally gold color produucing mixture of red dye and yellow dye uniformly distributed throughout the resin coating.

2. The laminated article of Claim 1 wherein the liquid composition comprises (a) a polyene having at least two reactive unsaturated carbon to carbon bonds per molecule, (b) a polythiol having at least two thiol groups per molecule, the total combined functionality of (1) the reactive unsaturated carbon to carbon bonds per molecule in the polyene and (2) the thiol groups per molecule in the polythiol being greater than four, and (c) a photocuring rate accelerator.

3. The laminated article of Claim 2 wherein the liquid curable composition includes regions of photocured composition adhered to the resin coating.

4. The laminated article of Claim 2 wherein the polyene component of the liquid curable composition is a mixture of compounds having the following formulas:

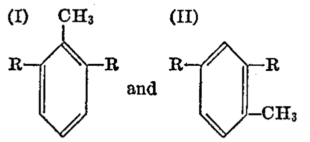

wherein R is the group having the following formula:

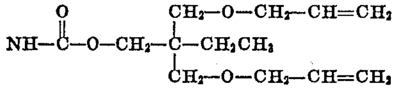

which is ring attached through the nitrogen atom thereof.

5. The laminated article of Claim 4 wherein the ratio of the compound having formula (I) to the compound having formula (II) is about 20 parts by weight to about 80 parts by weight of (I) to (II).

6. The laminated article of Claim 5 wherein the liquid curable composition includes regions of photocured composition adhered to the resin coating.

7. The laminated article of Claim 1 wherein a first chromate conversion coating is over a first surface of the aluminum sheet and a second chromate conversion coating is over a second surface of the aluminum sheet, said conversion coatings each having thereover a resin coating comprising a poly(vinyl chloride/vinyl acetate), at least one of said resin coatings having a generally gold color producing mixture of red dye and yellow dye uniformly distributed throughout, said layer of liquid curable composition being over a resin coating having said distributed dye mixture.

8. The laminated article of Claim 1 wherein (a) the aluminum sheet has thickness from about 5 to 15 mils and temper from about H12 to about H19, (b) the chromate conversion coating is included at the rate of about 25 to about 50 milligrams, dry basis, per square foot of the sheet, and (c) the resin coating comprising poly(vinyl chloride/vinyl acetate) has subustantially uniform thickness from about 0.01 to about 1 mil.

9. A process for preparing a laminated composite article, for use as a printing plate with an applied layer of liquid photocurable composition, said process comprising applying a solvent-dispersed resin comprising poly(vinyl chloride/vinyl acetate) over a chromate-treated surface of an aluminum sheet, said resin including a generally gold color producing mixture of red dye and yellow dye dispersed throughout, and drying the applied resin to form a substantially solvent-free vinyl resin coating having thickness from 0.01 to about 1 mil and having a generally gold color producing mixture of red dye and yellow dye dispersed throughout, and applying a layer of liquid photocurable composition over the resin coating.

10. The process of Claim 9 wherein the applied resin is dried at a temperature not exceeding about 420° F.

11. A process for preparing a printing plate which comprises selectively exposing the article of Claim 1 to actinic radiation in the layer of liquid photocurable composition to insolubilize the exposed areas with non-exposed liquid composition remaining generally liquid and removable.

References Cited

UNITED STATES PATENTS

| | | | |
|---|---|---|---|
| 3,265,504 | 8/1966 | Leonard et al. | 96—86 R |
| 3,511,661 | 5/1970 | Rauner et al. | 96—33 |
| 3,537,853 | 11/1970 | Wessells et al. | 96—115 R |
| 3,733,200 | 5/1973 | Takaishi et al. | 96—86 R |
| 3,748,190 | 7/1973 | Weber et al. | 148—6.2 |

J. TRAVIS BROWN, Primary Examiner

U.S. Cl. X.R.

96—86 R; 117—132 C; 148—6.2